US006118698A

United States Patent [19]
Akaogi et al.

[11] Patent Number: 6,118,698
[45] Date of Patent: Sep. 12, 2000

[54] OUTPUT MULTIPLEXING IMPLEMENTATION FOR A SIMULTANEOUS OPERATION FLASH MEMORY DEVICE

[75] Inventors: Takao Akaogi, Cupertino; Kazuhiro Kurihara, Sunnyvale; Tien-Min Chen, San Jose, all of Calif.

[73] Assignee: Advanced Micro Devices, Inc., Sunnyvale, Calif.

[21] Appl. No.: 09/422,199

[22] Filed: Oct. 19, 1999

[51] Int. Cl.[7] .................................................. G11C 16/04
[52] U.S. Cl. ............................... 365/185.11; 365/185.23; 365/185.33; 365/230.03; 365/230.04; 365/230.06; 365/230.08
[58] Field of Search .......................... 365/185.11, 185.23, 365/185.33, 230.01, 230.03, 230.04, 230.06, 230.08

[56] References Cited

U.S. PATENT DOCUMENTS

| | | | |
|---|---|---|---|
| 5,263,000 | 11/1993 | Buskirk et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,745,401 | 4/1998 | Lee | 365/104 |
| 5,835,406 | 11/1998 | Chevallier et al. | 365/185.03 |
| 5,841,696 | 11/1998 | Chen et al. | 365/185.11 |
| 5,847,998 | 12/1998 | Buskirk | 365/185.33 |
| 5,867,430 | 2/1999 | Chen et al. | 365/189.04 |
| 5,912,852 | 6/1999 | Lawrence et al. | 365/201 |
| 5,959,881 | 9/1999 | Trimberger et al. | 365/182 |
| 5,999,480 | 12/1999 | Ong et al. | 365/230.06 |
| 6,005,803 | 12/1999 | Kuo et al. | 365/185.11 |
| 6,016,270 | 1/2000 | Thummalapally et al. | 365/185.11 |

OTHER PUBLICATIONS

Brian Dipert and Markus Levy "Designing with Flash Mrmory—The definitive guide to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology."
AMD, Technology Background brochure, "3.0 Volt–only Burst Mode Flash Memory Technology".
AMD, Technology Background brochure, "1.8 Volt–only Flash Memory Technology."
AMD, Technology Background brochure, "AMD DL160 and DL320 Series Flash: New Densities, New Features".
Intel Corporation, "Common Flash Memory Interface Specification", Release 1.1, May 30, 1997.
AMD, "Common Flash Memory Interface Publication 100—Vendor & Device ID Code Assignments", Jul. 25, 1996, vol. 96.1.
AMD "Am29DL162C/AM29DL163C 16 Megabit (2 M×8–Bit/1 M×16–Bit) CMOS 3.0 Volt–only, Simultaneous Operation Flash Memory", Publication 21533, Rev: C Amendment/+2, Jul. 14, 1999.
Intel Corporation, "1.8 Volt Intel® Dual–Plane Flash Memory 28F320D18 (×16)", Product Review Datasheet, Order Number: 290672–002, Oct. 1999.
Macronix International Co.,Lltd. "MXIC Advance Information MX29VW160T/B—16M–BIT [2M×8–BIT/1M× 16–BIT] Simultaneous Read/Write Single 2.5V Operation Flash Memory", P/N:PM0567, Rev. 0.8, May 17, 1999.
ATMEL Corporation, "ATMEL® 16–megabit (1M×16/2M× 8) 3–volt Only Flash Memory", Rev. 0925H–Aug. 1999.

(List continued on next page.)

*Primary Examiner*—Viet Q. Nguyen
*Attorney, Agent, or Firm*—Brinks Hofer Gilson & Lione

[57] ABSTRACT

A flash memory chip including a synchronization circuit for multiplexed sense amplifier output signal paths is disclosed. The synchronization circuit includes a signal generator, sense amplifiers and an output multiplexer. The arrival of data from the sense amplifiers to the output multiplexer is equalized. Equalization is achieved by adjusting the signal path length, and thereby the resistance and capacitance, of the signal paths from the signal generator to the sense amplifiers which carry the signal to cause the sense amplifiers to transmit their data to the output multiplexers.

42 Claims, 5 Drawing Sheets

OTHER PUBLICATIONS

STMicroelectronics, "M59DR032A, M59DR032B, 32 Mbit (2Mb×16, Dual Ban, Page) Low Voltage Flash Memory", preliminary data, Oct. 1999, pp. 1–38.

"AMD—Flash Introduction", obtained at the internet address http://www.amd.com/products/nvd/overview/flash_intro.html, Apr. 14, 1999.

"AMD—simultaneous Read/Write", obtained at the internet address http://www.amd.com/products/nvd/overview/simuintro.html, Jul. 12, 1999.

"AMD News Release #9879", obtained at the internet address http://www.amd.com/news/prodpr/9879.html.

"Intel® 1.8 Volt Dual–plane 32–Mbit Flash Memory (D18)", obtained at the internet address http://www.intel.com/design/flcomp/prodbref/298131.htm, Nov. 18, 1999.

U.S. application, No. 09/159,029, filed Sep. 23, 1998.

U.S. application, No. 09/159,142, filled Sep. 23, 1998.

U.S. application, No. 09/159,489, filed Sep. 23, 1998.

OUTPUT MULTIPLEXING IMPLEMENTATION FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM'S, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to a flash memory chip having a circuit for synchronizing multiplexed data arriving from sense amplifiers. The circuit avoids output glitches from the multiplexing circuit due to unequal signal timing. In particular, the preferred embodiments relate to equalizing signal delays in signal paths through the addition of resistance and capacitance to one signal path to equalize it with a second.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
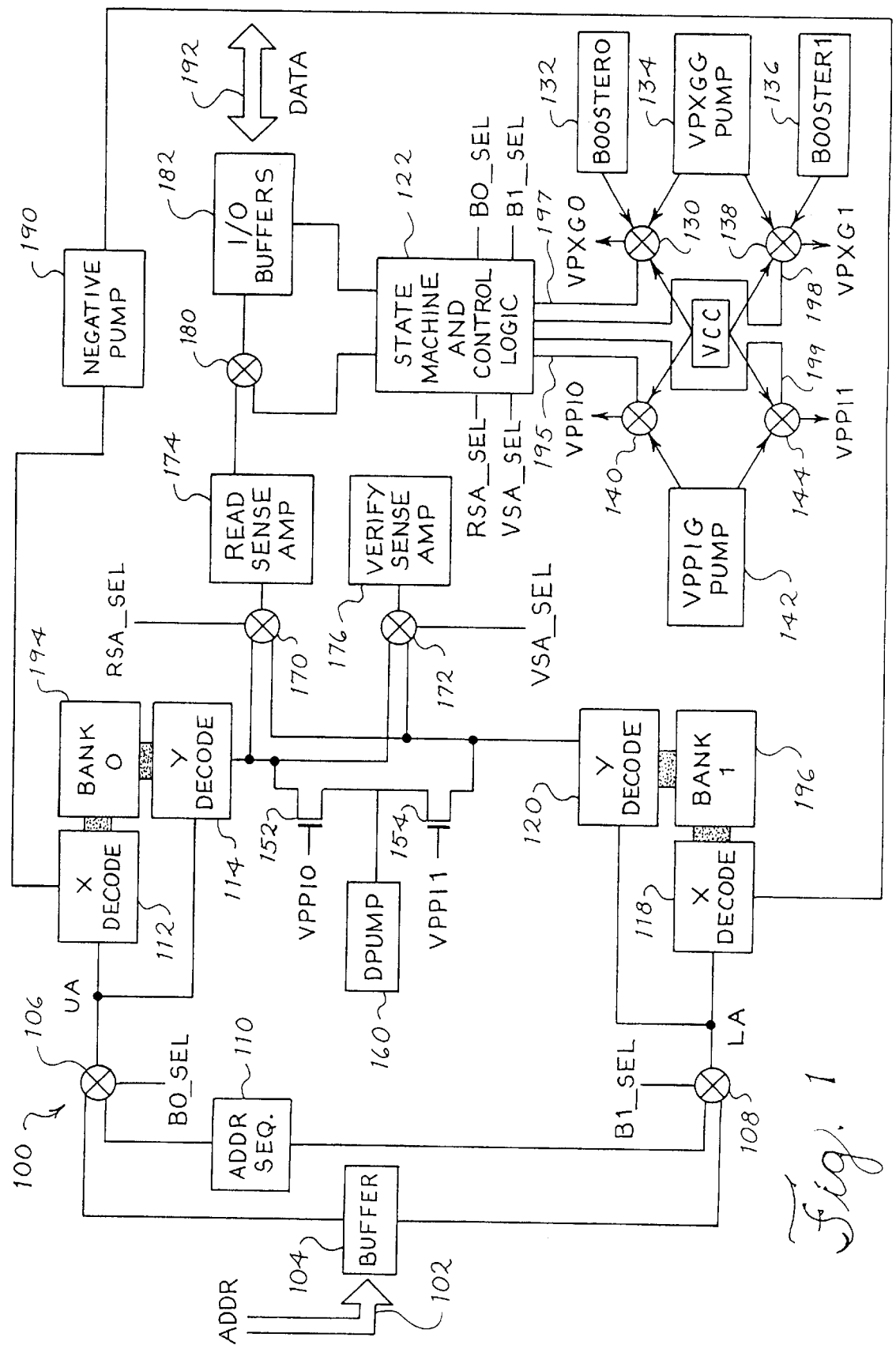
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,023, "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

Some of the difficulties in implementing a dual bank architecture for simultaneous reads and writes involve the implementation of the dual banks themselves. One difficulty with having two banks of flash memory cells is that each bank may require its own support circuitry. For example, each bank of the exemplary flash memory chip has its own set of read sense amplifiers which are used to sense and amplify the selected output data from the memory bank during a read operation. This output data is then routed to a multiplexer which determines which bank is being read from and selects that data to be passed on to the chip's data output pins.

When physically designing an integrated circuit, the designer may need to be careful about where particular circuitry is placed on the integrated circuit die. The individual circuits which make up the integrated circuit are typically interconnected using aluminum traces laid down on the chip as the metal layer(s). A typical integrated circuit may have two metal layers, metal1 and metal2, although more or fewer metal layers are possible. These traces are the wires which interconnect all the logic to make the chip function and make up the signal paths which carry the signals from circuit to circuit. These traces or signal paths are often characterized by a resistance and capacitance which indicates how much they impede the flow of electricity. In digital circuits, resistance and capacitance in a signal path impart a skewing effect on the digital signals passing through the particular signal path. This is often referred to as signal delay because this skewing has the effect of delaying the travel of the signal from one end of the signal path to the other. The resistance and capacitance of a particular signal path are primarily a function of the length of the aluminum trace, although trace width, thickness as well as interconnections with other traces or circuits can also affect these values. It will be appreciated that length is but one of many factors which affect signal path resistance and capacitance.

In designing digital circuits, the timing of signals is critical. For example, one logic circuit which is commonly used is the NAND gate. An exemplary NAND gate has two inputs and the following truth table:

| Input_1 | Input_2 | Input_1 NAND Input_2 |
|---------|---------|----------------------|
| 0       | 0       | 1                    |
| 0       | 1       | 1                    |
| 1       | 0       | 1                    |
| 1       | 1       | 0                    |

Note that if both inputs were to switch from 0 to 1 simultaneously, the output of the gate would switch immediately from 1 to 0. However, if Input_2 was delayed by 1 nanosecond in relation to the switching of Input_1, for example, then the switching of the output 1 to 0 would also be delayed by 1 nanosecond. This delayed switch could be critical where the output of the exemplary NAND gate is needed for some other time dependent function. Therefore, designers often try to minimize signal delay to avoid such timing glitches.

Figure 2:
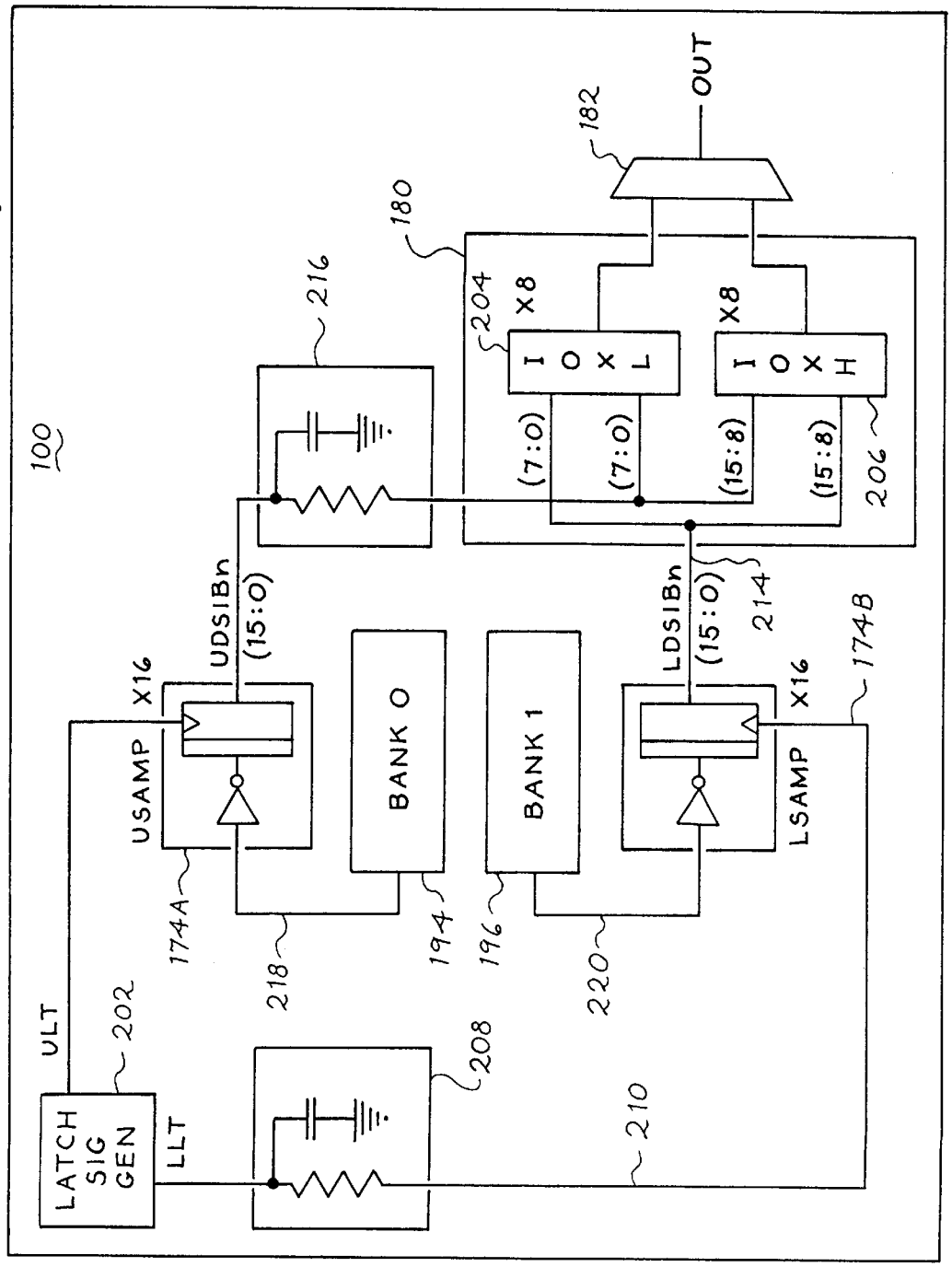
FIG. 2 depicts a simplified block diagram of the flash memory chip of FIG. 1, showing the preferred embodiment.

In one embodiment of the present invention, a multiplexed data path synchronization circuit is provided. Referring now to FIG. 2, there is shown a block diagram of the exemplary flash memory device 100 of FIG. 1, showing the output data signal paths. For the sake of clarity, a number of components of FIG. 1 have been deleted in FIG. 2. The memory device 100 further includes a latch signal generator 202, read sense amplifiers ("USAMP") 174A for bank 194, read sense amplifiers ("LSAMP") 174B for bank 196, low byte output multiplexers ("IOXL") 204 and high byte output multiplexers ("IOXH") 206. USAMP 174A and LSAMP 174B are shown as incorporated in read sense amplifiers 174 in FIG. 1. The output multiplexers 204 and 206 are incorporated in multiplexer 180 in FIG. 1.

The latch signal generator 202 is part of the state machine and control logic 122 and generates the latch signals 210, 212 (labeled "LLT" and "ULT") to the read sense amplifiers 174A and 174B to latch the output data 218, 220 from their respective memory banks. The latch signal generator 202 generates the LLT signal 210 to the LSAMP 174B for bank 196 and the ULT signal 212 to the USAMP 174A. There are 16 USAMP's 174A and 16 LSAMP's 174B to sense and amplify 16 bits from each bank. 194, 196.

Figure 3:
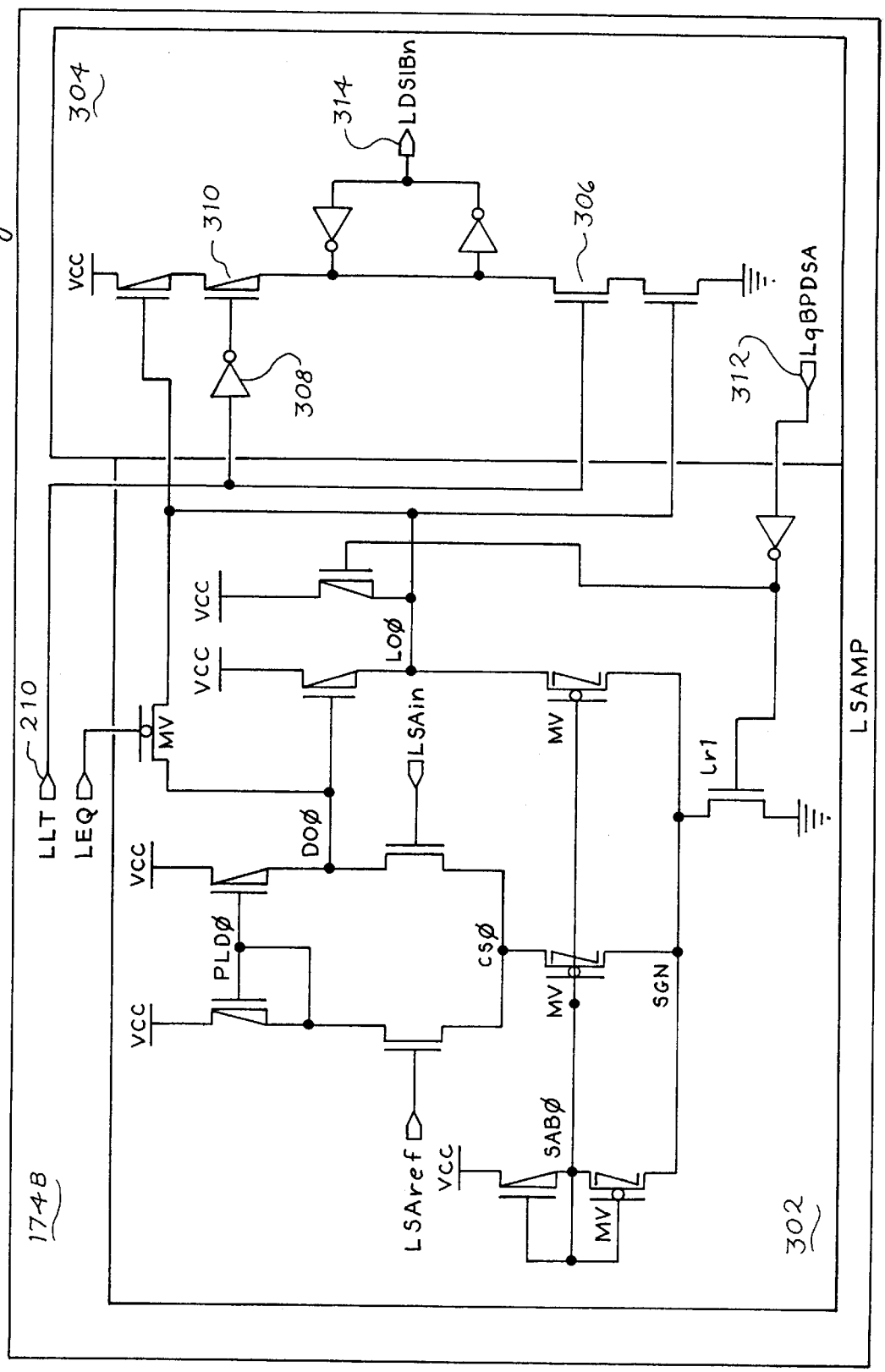
FIG. 3 depicts a schematic diagram of a lower bank sense amplifier according to the present invention for use with the flash memory chip of FIGS. 1 and 2.
Figure 4:
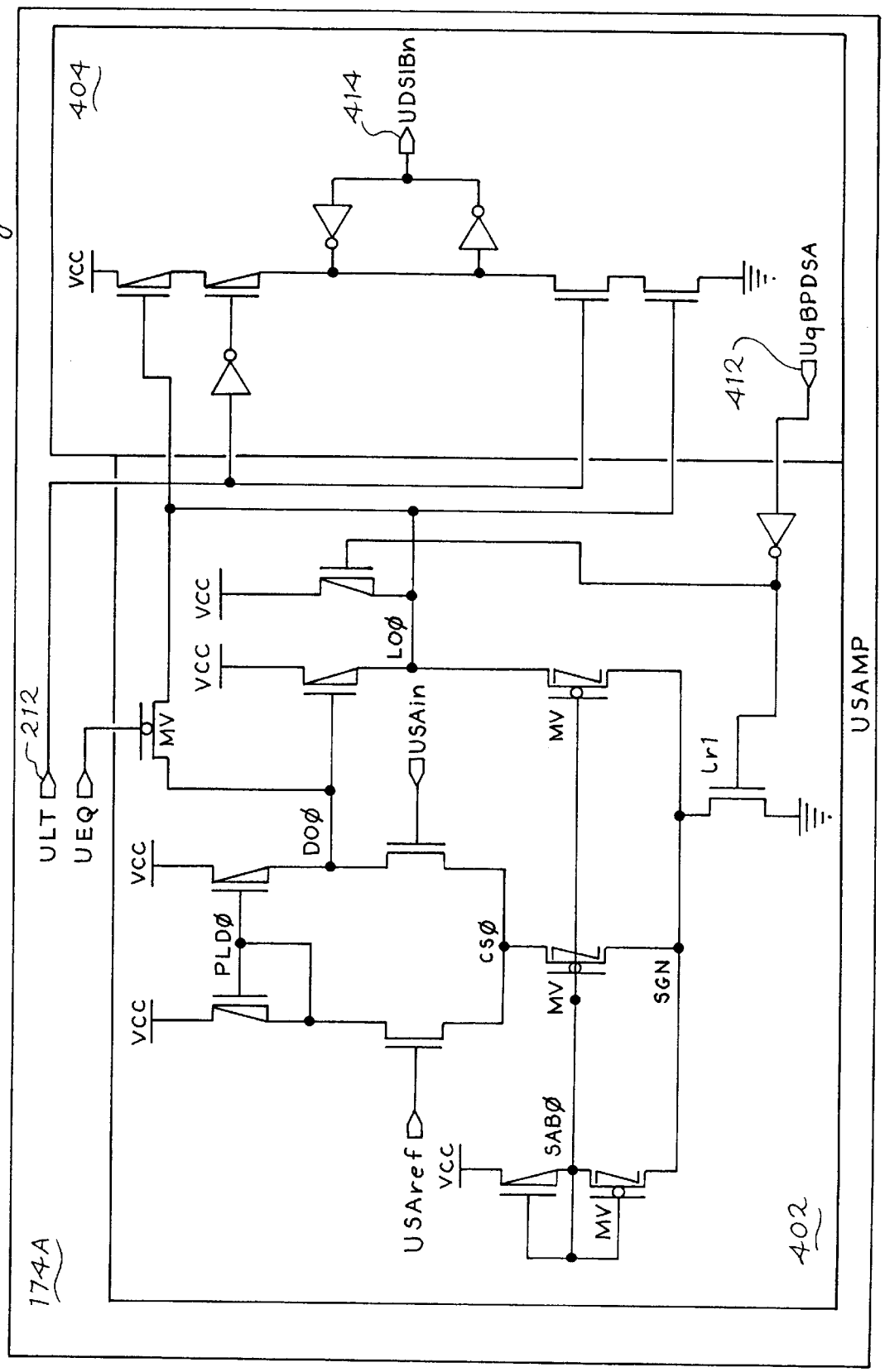
FIG. 4 depicts a schematic diagram of an upper bank sense amplifier according to the present invention for use with the flash memory chip of FIGS. 1 and 2.

Referring now to FIGS. 3 and 4, there is shown schematic diagrams of the USAMP 174A and the LSAMP 174B. In the memory device 100, there are 16 USAMP's 174A and 16 LSAMP's 174B. The LSAMP 174B of FIG. 3 and the USAMP 174A of FIG. 4 are identical circuits. Referring to FIG. 3, the LSAMP 174B includes inputs for the LLT signal 210 from the latch signal generator 202 and the data bit 312 (labeled "LSAin") from the memory bank 196. The LSAMP 174B further includes an output 314 (labeled "LDSIBn") which connects to the LDSIBn signal path 214 (In FIG. 4, for the USAMP 174A, this output is labeled UDSIBn 414 and connects to the UDSIBn signal path 216). The LSAMP 174B further includes an amplifier stage 302 and a latch stage 304. The latch stage 304 is controlled by the LLT signal 210 which connects to an n-channel transistor 306 and through an inverter 308 to a p-channel transistor 310. The LLT signal 210 is connected to all 16 LSAMP's 174B and is an active high signal which causes the latch to latch data from the amplifier stage 302 when LLT=1. The transistors which make up the logic of the LSAMP 174B have the preferred channel length to width ratios indicated in the figure although other ratios may be used. The latch stage 304 of the LSAMP 174B connects to the output 314 (labeled "LDSIBn" (where n=0:15 for the 16 LSAMP's 174A)) which connects to the output multiplexers 204 and 206 via the LDSIBn signal path 216. Note that when bank 196 is not selected for a read, the amplifier stage 302 will supply a high value to the latch stage 304 This effectively holds LDSIBn 314 high (1) when bank 196 is not selected for a read operation.

Referring to FIG. 4, the USAMP 174A is identical to the LSAMP 174B except that the USAMP 174A is responsive to the ULT latch signal 212 from the latch signal generator 202, outputs UDSIBn 414 to the output multiplexers 204 and 206 via the UDSIBn signal path 216 and holds UDSIBn 414 high when bank 194 is not selected for a read operation.

The USAMP 174A and LSAMP 174B are standard differential amplifiers which can operate at either 2 Volts or 3 Volts (which can be set by a metal layer fabrication option). The last stage of the amplifier 174A, 174B includes an EQ circuit which equalizes the input and output stages of the amplifier 174A, 174B. The latch stage 304 of the amplifier 174A, 174B further includes a middle Vcc trip point. The trip point of the EQ stage is set at about ½Vcc to realize fast operation time. With the latch stage 304 following the EQ stage, once the latch stage 304 latches the data, the data input and amplifiers 174A, 174B do not have to be active.

Figure 5:
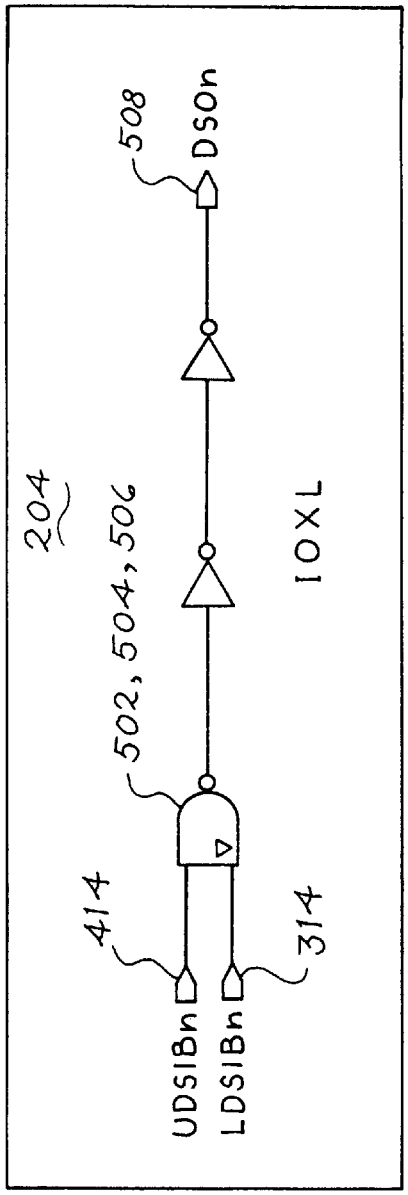
FIG. 5 depicts a schematic diagram of a low byte output multiplexer according to the present invention for use with the flash memory chip of FIGS. 1 and 2.

FIG. 5 depicts the preferred low byte output multiplexer 204 of FIG. 2. There are 8 output multiplexers 204 for the 8 bits of the lower byte of data to be passed to the I/O buffers 182. The output multiplexer 204 has inputs for the UDSIBn output 414 of the USAMP 174A and the LDSIBn output 314 of the LSAMP 174B. The output multiplexer 204 further includes inputs for other data to be multiplexed to the I/O buffers 182 depending on the mode of operation of the preferred flash memory device. The inputs, UDSIBn 314 and LDSIBn 414 connect to NAND gates 502 and 504 which in turn connect to NAND gate 506. This logical structure implements a multiplexing scheme. When all but one input is held high to the NAND gate 506, the changing input will control the output of the gate (See the discussion of NAND gates and the accompanying truth table above). This multiplexing circuit is based on only one input changing at any given time. The output multiplexer 204 further includes an output 508 (labeled "DSOn") which connects to the I/O buffers 182 of the flash memory device 100.

Figure 6:
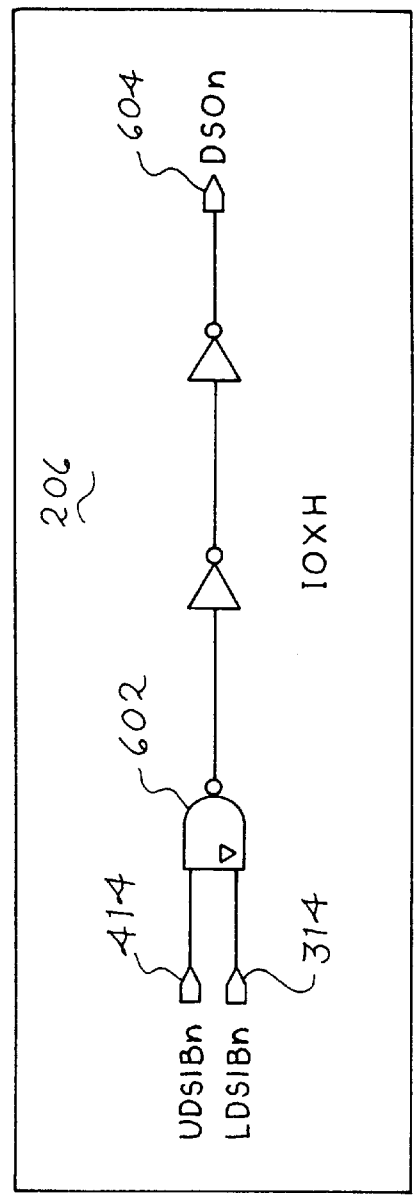
FIG. 6 depicts a schematic diagram if a high byte output multiplexer according to the present invention for use with the flash memory chip of FIGS. 1 and 2.

FIG. 6 depicts the preferred high byte output multiplexer 206 of FIG. 2. There are 8 output multiplexers 206 for each bit of the high byte of data to be passed to the I/O buffers 182. The high byte output multiplexers 206 perform the same function as the low byte output multiplexers 204 except that the high byte output multiplexer 206 only multiplexes between the upper and lower bank data outputs. UDSIBn 414 and LDSIBn 314. The high byte output multiplexer 206 provides inputs for UDSIBn 414 and LDSIBn 314 from the 16 USAMP's 174A and LSAMP's 174B and output 604 which connects to the I/O buffers 182. These inputs connect to a NAND gate 602 which performs the multiplexing function. UDSIBn and LDSIBn default to a high value when the their respective banks are not selected for a read operation. This allows the selected bank to control the NAND gate 602 to pass the output to the I/O buffers 182. Note that the output of the high and low output multiplexers 204 and 206 is further gated by the DMUX signal.

Note that because the output multiplexers 204 and 206 are implemented using NAND gates, there is the potential for the above described timing glitch to occur. Therefore the UDSIBn 414 and LDSIBn 314 signals may need to switch at substantially the same time to avoid and output glitch from the output multiplexers 204 and 206 from the delay introduced in the LDSIBn signal path 214 and the UDSIBn signal path 216.

Referring back to FIG. 2, it is shown that the USAMP 174A is located at the top of the device 100, close to bank 194 of the memory array. However, LSAMP 174B is located at the bottom of the device 100, close to bank 196 of the memory array. In addition, the output multiplexers 204 and 206 are also located at the bottom of the device 100.

With this arrangement, the LDSIBn signal paths 214 from the LSAMP's 174B to the output multiplexers 204 and 206 are much shorter than the UDSIBn signal paths 216 from the USAMP's 174A. LDSIBn 314 and UDSIBn 414 need to arrive at the output multiplexers 204 and 206 at substantially the same time to avoid an output glitch. However, due to the unequal signal path lengths between signal path 214 and signal path 216, the signals will not arrive at the same time even though they are sent simultaneously.

Therefore, in order to equalize these signal paths 214 and 216, delay is added to the LLT signal path 210 in the form of resistance and/or capacitance 218. This delay is added by placing the latch signal generator 202 at the top of the device 100 thereby lengthening the LLT signal path 210. This added resistance and capacitance matches the resistance and capacitance 220 inherent in the UDSIBn signal paths which must also run from the top of the flash memory device 100 and equalizes the delay. In this way, the latching of the output data from bank 196 and therefore the switching of LDSIBn 314 is delayed by an equivalent amount as it takes for the UDSIBn signals 414 to travel over the UDSIBn signal paths 216. This results in LDSIBn 314 and UDSIBn 414 arriving at the output multiplexers 204 and 206 at substantially the same time. It will be appreciated that there are other methods of imparting delay in a signal path, including connecting physical capacitance and resistance in the form of capacitors and resistors as well as utilizing buffer circuits. Note that while delay could have been added to the LDSIBn signal path 314, using the LLT signal path 210 to delay the LDSIBn signal path 314 instead, has the advantage that delay need only be added to 1 signal versus 16 signals in the LDSIBn signal path 314

In the memory device 100, having a capacity of 32 Mb, the preferred path length of the ULT signal 212 is 1,500 microns ($\mu$m) yielding an approximate resistance and capacitance of 100 Ohms and 0.3 pico-farads and a delay of 0.5 nanoseconds (ns). The preferred path length of the LLT signal 210 is 15,000 $\mu$m yielding an approximate resistance and capacitance of 1,000 Ohms and 3 pico-farads and a delay of 2–3 ns. The preferred path length of the UDSIBn signal 216 is 15,000 $\mu$m yielding an approximate resistance and capacitance of 1,000 Ohms and 3 pico-farads and a delay of 2–3 ns. The preferred path length of the LDSIBn signal 214 is 1,500 $\mu$m yielding an approximate resistance and capacitance of 100 Ohms and 0.3 pico-farads and a delay of 0.5 ns. For the memory device 100 with a capacity of 16 Mb, the values for the ULT and LDSIBn signal paths 212, 214 are about the same however the values for the LLT and UDSIBn signal paths 218, 216 are approximately ½ of those for the 32 Mb device 100. In the memory device 100 with a 32 Mb capacity, the total path length from the latch signal generator 202 to the output multiplexer 204 and 206 over the LLT/LDSIBn or ULT/UDSIBn paths is approximately 16,500 $\mu$m, with a resistance of 1,100 Ohms, a capacitance of 3.3 pico-farads and delay of 2–3.5 ns. In the memory device 100 with a capacity of 16 Mb, the path lengths are approximately 9,000 $\mu$m, with a resistance of 600 Ohms, a capacitance of 1.8 pico-farads and a delay of 1–2 ns.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A flash memory chip comprising:
   a first bank;
   a second bank;
   a signal path synchronization circuit comprising:
      a latch signal generator;
      first and second amplifiers coupled with said first and second banks, said first and second amplifiers including:

first and second latches coupled with said latch signal generator by first and second signal paths, said first signal path defining a first time delay;

an output multiplexer coupled with said first and second latches by first and second data paths, said second data path defining a second time delay;

wherein said first time delay is approximately the magnitude as said second time delay.

2. The flash memory chip of claim 1, wherein said flash memory chip is capable of simultaneous operation.

3. The flash memory chip of claim 1, wherein the magnitude of said first time delay equals the magnitude of said second time delay.

4. The flash memory chip of claim 1, wherein said first and second time delays are approximately 1.5 nanoseconds.

5. The flash memory chip of claim 1, wherein the magnitude of said first time delay is created by resistance.

6. The flash memory chip of claim 5, wherein said first signal path is further defined by a length and further wherein said resistance is a function of said length.

7. The flash memory chip of claim 6, wherein said first signal path is approximately 15,000 microns in length.

8. The flash memory chip of claim 6, wherein said first signal path is approximately 7,500 microns in length.

9. The flash memory chip of claim 5, wherein said first signal path has an approximate resistance of 1,000 Ohms.

10. The flash memory chip of claim 5, wherein said first signal path has an approximate resistance of 500 Ohms.

11. The flash memory chip of claim 5, wherein said first signal path comprises a resistor.

12. The flash memory chip of claim 1, wherein the magnitude of said first time delay is created by capacitance.

13. The flash memory chip of claim 12, wherein said first signal path is further defined by a length and further wherein said capacitance is a function of said length.

14. The flash memory chip of claim 13, wherein said first signal path is approximately 15,000 microns in length.

15. The flash memory chip of claim 13, wherein said first signal path is approximately 7,500 microns in length.

16. The flash memory chip of claim 12, wherein said first signal path has a capacitance of approximately 3 pico-farads.

17. The flash memory chip of claim 12, wherein said first signal path has a capacitance of approximately 1.5 pico-farads.

18. The flash memory chip of claim 12, wherein said first signal path comprises a capacitor.

19. The flash memory chip of claim 1, wherein said first time delay is created by a buffer.

20. The flash memory chip of claim 1, wherein said first and second signal paths are defined by first and second signal path lengths wherein said first signal path length is greater than said second signal path length.

21. The flash memory chip of claim 20, wherein said first signal path is approximately 15,000 microns in length and said second signal path is approximately 1,500 microns in length.

22. The flash memory chip of claim 1, wherein said first and second data paths are defined by first and second data path lengths wherein said second data path length is greater than said first data path length.

23. The flash memory chip of claim 22, wherein said first data path is approximately 1,500 microns in length and said second data path is approximately 15,000 microns in length.

24. The flash memory chip of claim 1, wherein said first and second data paths are further defined by unequal path lengths.

25. The flash memory chip of claim 1, wherein said first and second signal paths are further defined by unequal path lengths.

26. An apparatus for synchronizing multiplexed data paths in a flash memory chip capable of simultaneous operation, said apparatus comprising:

first and second data banks that store and output data;

a latch signal generator for generating first and second latch signals;

first and second amplifiers coupled with said first and second data banks and operative to amplify said output data from said first and second data banks, said first and second amplifiers including:

first and second latches responsive to said first and second latch signals and operative to latch said output data, said first and second latches coupled with said latch signal generator by first and second signal paths, said first and second signal paths operative to carry said first and second latch signals, said first signal path being defined by a first signal delay;

at least one output multiplexer coupled with said first and second latches by first and second data paths operative to carry said output data, said output multiplexer operative to multiplex said output data, said second data path being defined by a second signal delay;

wherein said first signal delay is about the same as said second signal delay.

27. The apparatus of claim 26, wherein said first signal delay equals said second signal delay.

28. The apparatus of claim 26, wherein said first signal delay is created by resistance and capacitance.

29. The apparatus of claim 28, wherein said first signal path is further defined by a length and further wherein said resistance and capacitance are a function of said length.

30. The apparatus of claim 28, wherein said first signal path comprises a resistor and a capacitor.

31. The apparatus of claim 26, wherein said first signal delay is created by a buffer.

32. The apparatus of claim 26, wherein said first and second signal paths are defined by first and second signal path lengths wherein said first signal path length is greater than said second signal path length.

33. The apparatus of claim 26, wherein said first and second data paths are defined by first and second data path lengths wherein said second data path length is greater than said first data path length.

34. The apparatus of claim 26, wherein said first and second data paths are defined by unequal path lengths.

35. The apparatus of claim 26, wherein said first and second signal paths are defined by unequal path lengths.

36. A method for synchronizing multiplexed data paths in a flash memory chip comprising at least two banks, said method comprising:

generating first and second latch signals simultaneously;

receiving said first and second latch signals over first and second signal paths, said first and second signal paths defined by unequal signal delay between them;

generating first and second data outputs over first and second data output paths upon receipt of said first and second latch signals;

compensating for said unequal signal delay in said first signal path so that said first and second data outputs are generated simultaneously.

37. The method of claim 36, wherein said first signal path has a path length longer than said second signal path.

38. The method of claim 36, wherein said flash memory chip is capable of simultaneous operation.

39. The method of claim 36, wherein said compensating is achieved by increasing the path length of said first signal path.

40. The method of claim 36, wherein said compensating is achieved by adding a resistor to said first signal path.

41. The method of claim 36, wherein said compensating is achieved by adding a capacitor to said first signal path.

42. The method of claim 36, wherein said compensating is achieved by adding a buffer to said first signal path.

* * * * *

UNITED STATES PATENT AND TRADEMARK OFFICE
CERTIFICATE OF CORRECTION

PATENT NO.    : 6,118,698
DATED         : September 12, 2000
INVENTOR(S)   : Takao Akaogi et al.

It is certified that error appears in the above-identified patent and that said Letters Patent is hereby corrected as shown below:

On the Title Page

In column 1, item [73], immediately after "Calif." please insert --; Fujitsu Limited, Japan--.

Signed and Sealed this

First Day of May, 2001

Attest:

NICHOLAS P. GODICI

Attesting Officer      *Acting Director of the United States Patent and Trademark Office*

UNITED STATES PATENT AND TRADEMARK OFFICE
CERTIFICATE OF CORRECTION

PATENT NO. : 6,118,698
DATED : September 12, 2000
INVENTOR(S) : Takao Akaogi et al.

It is certified that error appears in the above-identified patent and that said Letters Patent is hereby corrected as shown below:

Title page,
Column 1,
Line 2, under "OTHER PUBLICATIONS", change "Mrmory" to -- Memory --.

Column 2,
Line 21, change "Co.,Lltd." to -- Co., Ltd. --

Page 2,
Column 1,
Line 2, under "OTHER PUBLICATIONS", change "Ban," to -- Bank, --.

Column 2,
Line 6, change "htm" to -- html --.

Signed and Sealed this

Ninth Day of October, 2001

*Attest:*

NICHOLAS P. GODICI
*Attesting Officer*    *Acting Director of the United States Patent and Trademark Office*